United States Patent
Yun et al.

(10) Patent No.: US 6,201,760 B1
(45) Date of Patent: Mar. 13, 2001

(54) APPARATUS AND METHOD FOR PERFORMING DATA READ OPERATION IN DDR SDRAM

(75) Inventors: Mi-Kyung Yun; Jong-Hee Han, both of Ichon (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/461,718

(22) Filed: Dec. 16, 1999

(30) Foreign Application Priority Data

Dec. 30, 1998 (KR) .................................. 98-61071

(51) Int. Cl.[7] ........................................ G11C 8/00
(52) U.S. Cl. .................... 365/233; 365/194; 365/230.03
(58) Field of Search ............................... 365/233, 230.03, 365/230.04, 230.01, 194

(56) References Cited

U.S. PATENT DOCUMENTS

| | | | |
|---|---|---|---|
| 5,892,730 | * 4/1999 | Sato et al. | ............................. 365/233 |
| 6,011,751 | * 1/2000 | Hirabayashi | ......................... 365/236 |
| 6,016,280 | * 1/2000 | Maesako et al. | ..................... 365/226 |
| 6,044,032 | * 3/2000 | Li | .................................... 365/230.03 |

* cited by examiner

Primary Examiner—David Nelms
Assistant Examiner—Hoai V. Ho
(74) Attorney, Agent, or Firm—Jacobson, Price, Holman & Stern, PLLC

(57) ABSTRACT

A method for performing a read data operation in a double data rate (DDR) synchronous dynamic random access memory (SDRAM) capable of effectively issuing two data within one clock cycle for high-speed operation. The method includes the steps of simultaneously accessing two memory cells and prefetching data stored in the two memory cells, which includes first and second bit data. The method continues by latching the first and second bit data, generating signals to synchronize the first and second bit data with rising and falling edges of a clock and to control an issue of the first and second bit data, and issuing the first and second bit data in response to the generated signals.

20 Claims, 2 Drawing Sheets

APPARATUS AND METHOD FOR PERFORMING DATA READ OPERATION IN DDR SDRAM

FIELD OF THE INVENTION

The present invention relates to a double data rate (DDR) synchronous dynamic random access memory (SDRAM); and, more particularly, to an apparatus and method for performing a data read operation in the DDR SDRAM.

DESCRIPTION OF THE PRIOR ART

Generally, a conventional synchronous dynamic random access memory (SDRAM) synchronized with an external system clock has been employed to improve the operation speed of a dynamic random access memory (DRAM). Up to date, in order to further improve the operation speed, a concept of a double data rate (DDR) synchronous dynamic random access memory (SDRAM) has been suggested. A conventional SDRAM employs only a rising edge of a clock, while the DDR SDRAM employs both rising and falling edges of the clock.

However, a conventional apparatus for performing a data read operation used in the DRAM or SDRAM does not execute a data read operation based on the both edges in the DDR SDRAM. Therefore, it is strongly needed that an apparatus for performing a data read operation in a DDR SDRAM, which is capable of issuing data at both rising and falling edges of the clock.

SUMMARY OF THE INVENTION

It is, therefore, an object of the present invention to provide an apparatus for performing a data read operation in a DDR SDRAM that is capable of efficiently issuing two data within one clock by using two-bit prefetch and pipeline schemes.

It is, therefore, another object of the present invention to provide a method for performing a data read operation in a DDR SDRAM that is capable of efficiently issuing two data within one clock by using two-bit prefetch and pipeline schemes.

In accordance with one aspect of the present invention, there is provided a double data rate (DDR) synchronous dynamic random access memory (SDRAM), comprising: a memory cell core circuit for simultaneously accessing two memory cells and prefetching data stored in the two memory cells, wherein the two memory cells include first and second memory cells, the first and second memory cells storing first and second bit data, respectively; a signal generating means for generating signals to synchronize the first and second bit data with rising and falling edges of a clock and control an issue of the first and second bit data; and a pipeline latch means for latching the first and second bit data prefetched by said memory cell core circuit and issuing the first and second bit data in response to the signals generated by said signal generating means.

In accordance with another aspect of the present invention, there is provided a method for performing a read data operation in a double data rate (DDR) synchronous dynamic random access memory (SDRAM), comprising the steps of: a) simultaneously accessing two memory cells and prefetching data stored in the two memory cells, wherein the two memory cells store first and second bit data, respectively; b) latching the first and second bit data; c) generating signals to synchronize the first and second bit data with rising and falling edges of a clock and control an issue of the first and second bit data; and d) issuing the first and second bit data in response to the generated signals.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 1:
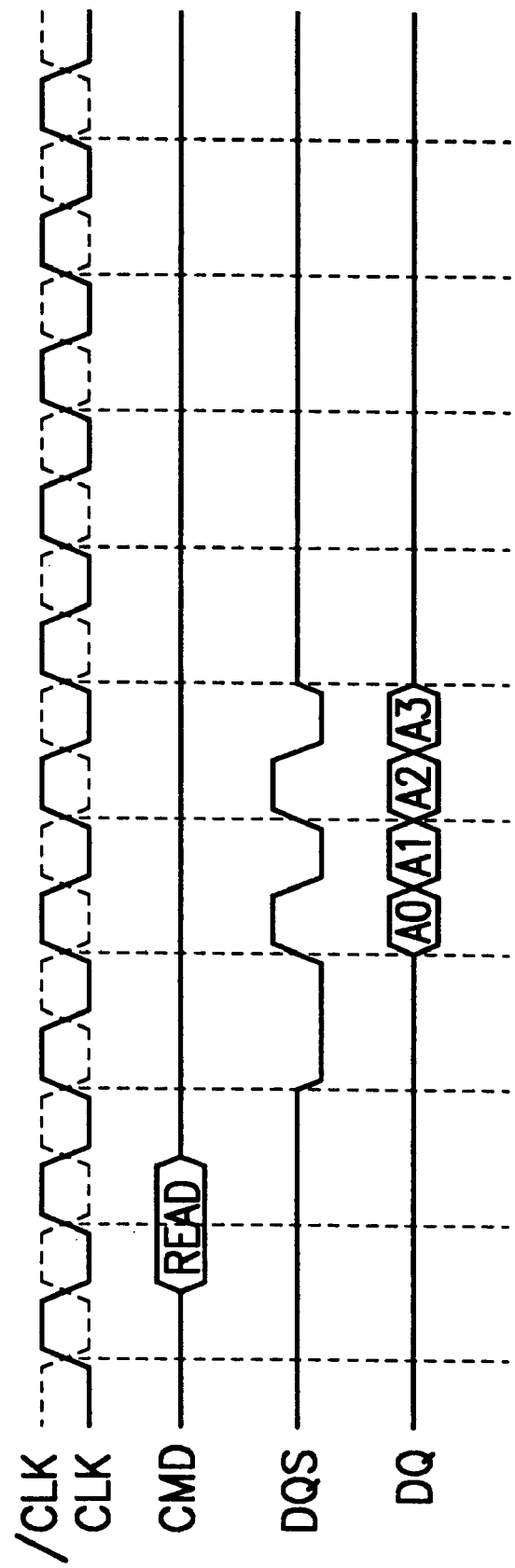
FIG. 1 shows a timing diagram at a data read operation in a DDR SDRAM.

Referring to FIG. 1, there is shown a timing diagram at a data read operation in a DDR SDRAM. At first, the term "column address strobe (CAS) latency value" means the number of clocks needed until data is issued at a point of time when a read command has issued. Also, the term "burst length value" means the number of consecutive data. As shown, the CAS latency value is 2 and the burst length value is 4. When data is read in the DDR SDRAM, the data should be issued at the rising and falling edges of a clock in response to an enable state of a data strobe signal DQS. A conventional SDRAM employs only a rising edge of a clock, while the DDR SDRAM employs both of rising and falling edges of the clock. Accordingly, the DDR SDRAM can implement high-speed operation.

Figure 2:
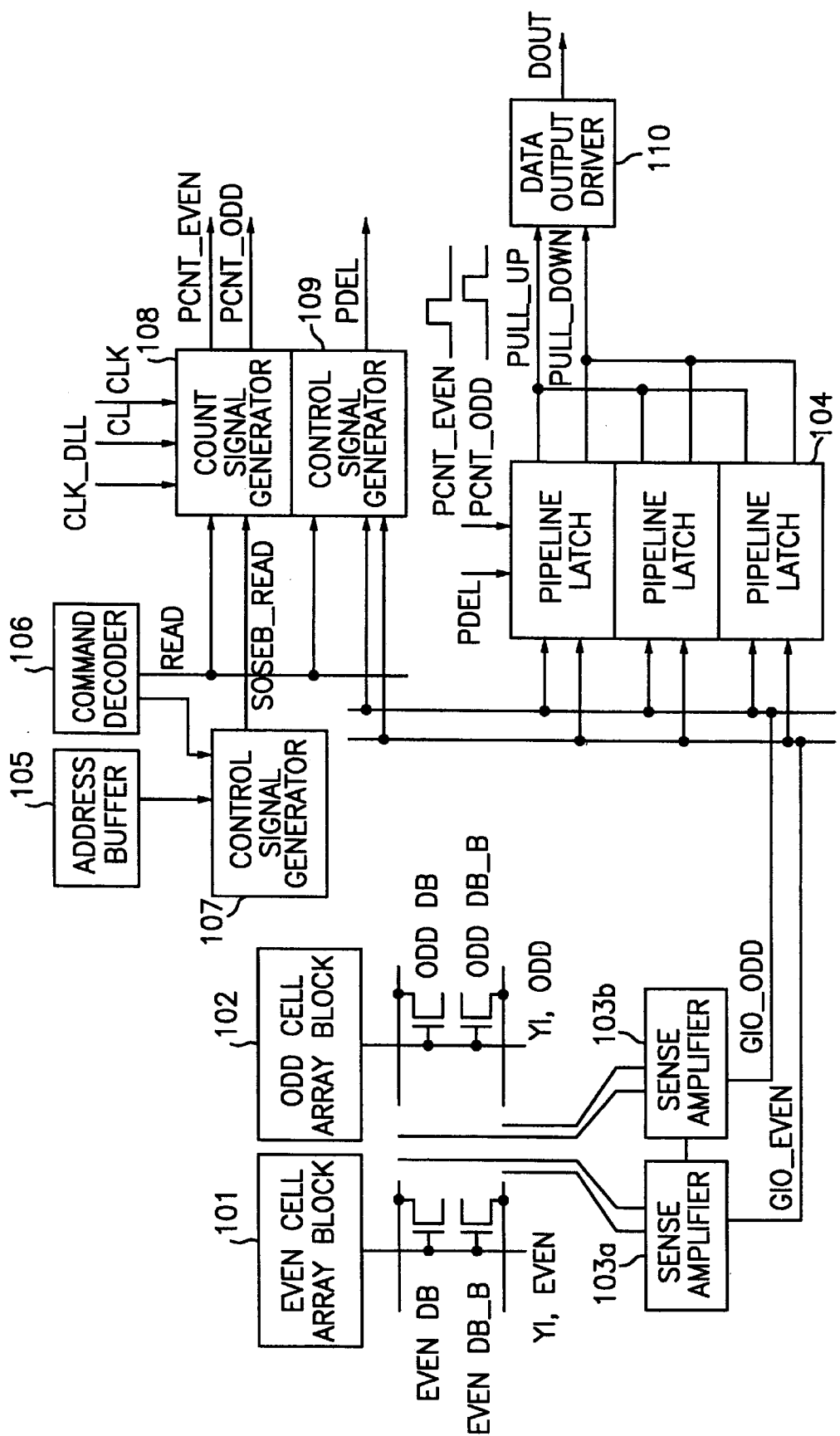
FIG. 2 depicts a block diagram of an apparatus for performing a data read operation in a DDR SDRAM in accordance with the present invention.

Referring to FIG. 2, there is shown an apparatus for a data read operation in a DDR SDRAM in accordance with the present invention. As shown, a memory cell array is divided into an even cell array block 101 and an odd cell array block 102. The even cell array block 101 accesses an even memory cell (not shown) and prefetches an even data of the even memory cell, wherein the even cell array block 101 includes the even memory cell. The odd cell array block 102 accesses an odd memory cell (not shown) and prefetches an odd data of the odd memory cell, wherein the odd cell array block 102 includes the odd memory cell.

A sense amplifier 103a sense-amplifies the even data prefetched by the even cell array block 101. A sense amplifier 103b sense-amplifies the odd data prefetched by the odd cell array block 102. The sense amplifiers 103a and 103b sense-amplify the even and odd data at the same time, respectively.

A global input/output line is divided into a global input/output line GIO_EVEN and a global input/output line GIO_ODD. The global input/output line GIO_EVEN transfers the even data sense-amplified by the sense amplifier 103a. The global input/output line GIO_ODD transfers the odd data sense-amplified by the sense amplifier 103b.

A pipeline latch 104 latches the even and odd data transferred from the global input/output lines GIO_EVEN and GIO_ODD.

A control signal generator 107 receives an address signal from an address buffer 105 and a read command READ from a command decoder 106. The control signal generator 107 generates a control signal SOSEB_READ to determine a priority of the even and odd data issued in response to the address signal and the read command READ. The priority of the even and odd data determines an issue order of the even and odd data. The priority of the even and odd data is determined by the address signal.

A count signal generator 108 generates count signals PCNT_EVEN and PCNT_ODD in response to the read command READ, the control signal SOSEB_READ, a CAS latency signal CL, a clock signal CLK and a clock delay locked loop signal CLK_DLL, wherein the CAS latency signal CL, the clock signal CLK and the clock delay locked loop signal CLK_DLL are transmitted from an external circuit (not shown). The count signal generator 108 generates the count signal PCNT_EVEN at a rising edge of a clock. Further, the count signal generator 108 generates the count signal PCNT_ODD at a falling edge of the clock. The count signal generator 108 activates one of the count signals PCNT_EVEN and PCNT_ODD in response to the control signal SOSEB_READ.

A control signal generator 109 detects whether the global input/output lines GIO_EVEN and GIO_ODD are loaded with the even and odd data in response to the read command READ, the CAS latency signal CL, the clock signal CLK and the clock delay locked loop signal CLK_DLL. Then, the control signal generator 109 generates a control signal PDEL.

The pipeline latch 104 issues the even and odd data in response to the activated signal between the count signals PCNT_EVEN and PCNT_ODD and the control signal PDEL.

A data output driver 110 sequentially outputs the even and odd data issued from the pipeline latch 104.

Accordingly, the DDR SDRAM in accordance with the present invention is capable of effectively issuing even and odd data within one clock by simultaneously accessing two memory cells and prefetching the even and odd data stored in the two memory cells, generating signals to synchronize the even and odd data with rising and falling edges of a clock and control an issue of the even and odd data, and issuing the even and odd data in response to the generated signals.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A double data rate (DDR) synchronous dynamic random access memory (SDRAM), comprising:
   a memory cell core circuit for simultaneously accessing two memory cells and prefetching data stored in the two memory cells, wherein the two memory cells include first and second memory cells, the first and second memory cells storing first and second bit data, respectively;
   a signal generating means for generating signals to synchronize the first and second bit data with rising and falling edges of a clock and control an issue order of the first and second bit data, said signal generating means including a count signal generating means for generating a first count signal at the rising edge of the clock and a second count signal at the falling edge of the clock of a single clock cycle, said count signal generating means for activating one of the first and second count signals in response to a first control signal and outputting the activated signal; and
   a pipeline latch means for latching the first and second bit data prefetched by said memory cell core circuit and issuing the first and second bit data in response to the activated signal output by said signal generating means.

2. The DDR SDRAM as recited in claim 1, wherein said memory cell core circuit includes:
   a first cell array block for accessing the first memory cell and prefetching the first bit data stored in the first memory cell, wherein said first cell array block includes the first memory cell;
   a second cell array block for accessing the second memory cell and prefetching the second bit data stored in the second memory cell, wherein said second cell array block includes the second memory cell;
   a first sense amplifier for sense-amplifying the first bit data prefetched by said first cell array block; and
   a second sense amplifier for sense-amplifying the second bit data prefetched by said second cell array block.

3. The DDR SDRAM as recited in claim 2, further comprising:
   a first global input/output line for transferring the first bit data from said memory cell core circuit to said pipeline latch means; and
   a second global input/output line for transferring the second bit data from said memory cell core circuit to said pipeline latch means.

4. The DDR SDRAM as recited in claim 3, wherein said signal generating means further includes:
   a first control signal generating means for generating the first control signal to determine a priority of the first and second bit data issued in response to an address signal and a read command, wherein the priority of the first and second bit data determines an issue order of the first and second bit data;
   said count signal generating means activating one of the first and second count signals in response to the first control signal, a CAS latency signal, the clock and a clock delay locked loop signal; and
   a second control signal generating means responsive to the read command, the CAS latency signal, the clock and the clock delay locked loop signal for detecting whether said first and second global input/output lines are loaded with the first and second bit data, respectively and generating a second control signal to output the second control signal to said pipeline latch means.

5. The DDR SDRAM as recited in claim 4, wherein said pipeline latch means latches the first and second bit data prefetched by said memory cell core circuit and issuing the first and second bit data in response to the second control signal and the activated signal.

6. The DDR SDRAM as recited in claim 4, wherein the priority of the first and second bit data is determined by the address signal.

7. The DDR SDRAM as recited in claim 1, further comprising a means for outputting the first and second bit data issued from said pipeline latch means.

8. A method for performing a read data operation in a double data rate (DDR) synchronous dynamic random access memory (SDRAM), comprising the steps of:
   a) simultaneously accessing two memory cells and prefetching data stored in the two memory cells, wherein the two memory cells store first and second bit data, respectively;
   b) latching the first and second bit data;
   c) generating signals to synchronize the first and second bit data with rising and falling edges of a clock and control an issue order of the first and second bit data, said step of generating including generating a first count signal at the rising edge of the clock and a second count signal at the falling edge of the clock and activating one of the first and second count signals in response to a first control signal; and d) issuing the first and second bit data in response to the generated signals.

9. The method as recited in claim 8, wherein said step a) includes the steps of:
   a1) simultaneously accessing the two memory cells and prefetching the first and second data stored in the two memory cells; and
   a2) sense-amplifying the first and second bit data prefetched.

10. The method as recited in claim 9, wherein said step c) further includes the steps of:
   c1) generating the first control signal to determine a priority of the first and second bit data issued in response to an address signal and a read command, wherein the priority of the first and second bit data determines an issue order of the first and second bit data;
   c2) generating said first and second count signals in response to the first control signal, a CAS latency signal, the clock and a clock delay locked loop signal, wherein the first and second count signals are generated at the rising and falling edges of a single clock cycle; and
   c3) detecting whether global input/output lines are loaded with the first and second bit data, respectively, in response to the read commend, the CAS latency signal, the clock and the clock delay locked loop signal and generating a second control signal.

11. The method as recited in claim 10, wherein said step d) includes the step of issuing the first and second bit data in response to the second control signal and the activated signal.

12. The method as recited in claim 11, wherein the priority of the first and second bit data contained in said step c1) is determined by the address signal.

13. A double data rate (DDR) synchronous dynamic random access memory (SDRAM), comprising:
   a memory cell core circuit for simultaneously accessing two memory cells and prefetching data stored in the two memory cells, wherein the two memory cells include first and second memory cells, the first and second memory cells storing first and second bit data, respectively;
   a signal generating means for generating signals to synchronize the first and second bit data with rising and falling edges of a clock and control an issue of the first and second bit data, said signal generating means including,
      a first control signal generating means for generating a first control signal to determine a priority of the first and second bit data issued in response to an address signal and a read command, wherein the priority of the first and second bit data determines an issue order of the first and second bit data;
      a count signal generating means for generating first and second count signals to activate one of the first and second count signals in response to the first control signal, a CAS latency signal, the clock and a clock delay locked loop signal and outputting the activated signal to said pipeline latch means, wherein the first and second count signals are generated at the rising and falling edges of the clock, respectively; and
      a second control signal generating means responsive to the read command, the CAS latency signal, the clock and the clock delay locked loop signal for generating and outputting a second control signal to said pipeline latch means; and
   a pipeline latch means for latching the first and second bit data prefetched by said memory cell core circuit and issuing the first and second bit data in response to output from said signal generating means.

14. The DDR SDRAM as recited in claim 13, wherein said pipeline latch means latches the first and second bit data prefetched by said memory cell core circuit and issues the first and second bit data in response to the second control signal and the activated signal.

15. The DDR SDRAM as recited in claim 13, wherein the priority of the first and second bit data is determined by the address signal.

16. The DDR SDRAM as recited in claim 13, further comprising a means for outputting the first and second bit data issued from said pipeline latch means.

17. A method for performing a read data operation in a double data rate (DDR) synchronous dynamic random access memory (SDRAM), comprising the steps of:
   a) simultaneously accessing two memory cells and prefetching data stored in the two memory cells, wherein the two memory cells store first and second bit data, respectively;
   b) latching the first and second bit data;
   c) generating signals to synchronize the first and second bit data with rising and falling edges of a clock and control an issue of the first and second bit data, said step of generating including,
      c1) generating a first control signal to determine a priority of the first and second bit data issued in response to an address signal and a read command, wherein the priority of the first and second bit data determines an issue order of the first and second bit data;
      c2) generating first and second count signals to activate one of the first and second count signals in response to the first control signal, a CAS latency signal, the clock and a clock delay locked loop signal, wherein the first and second count signals are generated at the rising and falling edges of the clock, respectively; and
      c3) detecting whether global input/output lines are loaded with the first and second bit data, respectively, in response to the read commend, the CAS latency signal, the clock and the clock delay locked loop signal and generating a second control signal; and
   d) issuing the first and second bit data in response to the generated signals.

18. The method as recited in claim 17, wherein said step a) includes the steps of:
   a1) simultaneously accessing the two memory cells and prefetching the first and second data stored in the two memory cells; and
   a2) sense-amplifying the first and second bit data prefetched.

19. The method as recited in claim 17, wherein said step d) includes the step of issuing the first and second bit data in response to the second control signal and the activated signal.

20. The method as recited in claim 17, wherein the priority of the first and second bit data contained in said step c1) is determined by the address signal.

* * * * *